US 7,754,525 B2

(12) United States Patent
Yamada et al.

(10) Patent No.: US 7,754,525 B2
(45) Date of Patent: Jul. 13, 2010

(54) FILM FORMATION METHOD AND MANUFACTURING EQUIPMENT FOR FORMING SEMICONDUCTOR LAYER

(75) Inventors: Jun Yamada, Ibaraki (JP); Masakazu Okada, Kyoto (JP); Mitsuyoshi Miyai, Nara (JP)

(73) Assignee: Konica Minolta Holdings Inc., Tokyo (JP)

( * ) Notice: Subject to any disclaimer, the term of this patent is extended or adjusted under 35 U.S.C. 154(b) by 773 days.

(21) Appl. No.: 11/595,388

(22) Filed: Nov. 9, 2006

(65) Prior Publication Data

US 2007/0111370 A1  May 17, 2007

(30) Foreign Application Priority Data

Nov. 14, 2005 (JP) .............................. 2005-328588

(51) Int. Cl.
*H01L 51/40* (2006.01)
(52) U.S. Cl. .......................................... 438/99; 349/94
(58) Field of Classification Search .................... 438/99
See application file for complete search history.

(56) References Cited

U.S. PATENT DOCUMENTS

| 5,752,986 | A | * | 5/1998 | Nishiyama et al. ......... 29/25.03 |
| 5,798,810 | A | * | 8/1998 | Tanioka et al. ............. 349/123 |
| 6,690,028 | B2 | | 2/2004 | Wakimoto et al. |
| 6,947,113 | B2 | * | 9/2005 | Inoue ........................ 349/124 |
| 7,364,622 | B2 | * | 4/2008 | Hasei et al. ................ 118/321 |
| 2003/0112407 | A1 | * | 6/2003 | Nakano et al. ............. 349/187 |

FOREIGN PATENT DOCUMENTS

| JP | 10-190001 | | 7/1998 |
| JP | 11-264978 | | 9/1999 |
| JP | 1999-264978 | * | 9/1999 |
| JP | 2003-057625 | * | 2/2003 |

OTHER PUBLICATIONS

Payne, Marcia M., Parkin, Sean R., Anthony, John E., Kuo, Chung-Chen, and Jackson, Thomas N., "Organic Field-Effect Transistors from Solution-Deposited Functionalized Acenes with Mobilities as High as 1 cm$^2$/V•s," Journal American Chemical Society, 2005, 127, pp. 4986-4987.

"Organic Thin Film Transistors for Large Area Electronics," Dimitrakopoulos, Christos D., and Malenfant, Patrick R.L., Advanced Materials, 2002,14, No. 2, Jan. 16, © Wiley-VCH Verlag GmbH, D-69469 Weinheim, 2002, 0935-9648/01/0201-0115, pp. 99-117.

* cited by examiner

*Primary Examiner*—Kiesha R Bryant
*Assistant Examiner*—Antonio B Crite
(74) *Attorney, Agent, or Firm*—Brinks Hofer Gilson & Lione

(57) ABSTRACT

The present invention provides a film forming method of a uniform semiconductor layer having a large area at a low cost and equipment to form said semiconductor layer, by blowing gas against a coated layer to shorten the drying time and to decrease uneven drying. A film forming method of a semiconductor layer characterized by being provided, after a process to coat a semiconductor material containing a solvent on a substrate, with a process to blow gas against a coated layer of a semiconductor layer containing said solvent to evaporate the solvent.

5 Claims, 4 Drawing Sheets

FIG. 1(1-a)
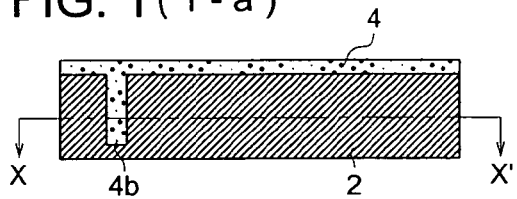
FIG. 1(1-b)
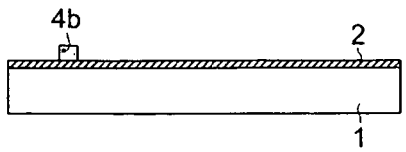
FIG. 1(2-a)
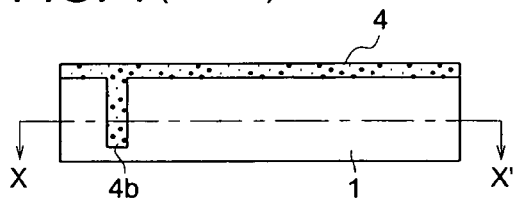
FIG. 1(2-b)
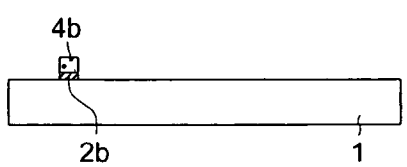
FIG. 1(3-a)
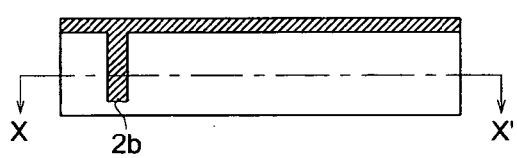
FIG. 1(3-b)
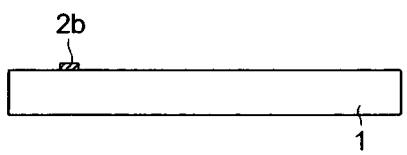
FIG. 1(4-a)
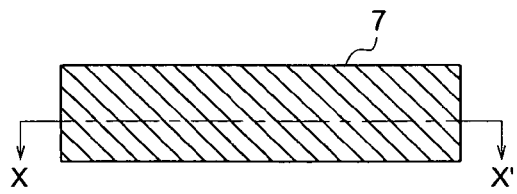
FIG. 1(4-b)
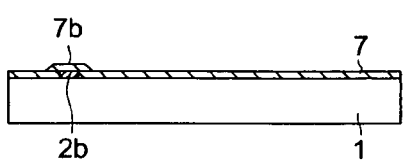
FIG. 1(5-a)
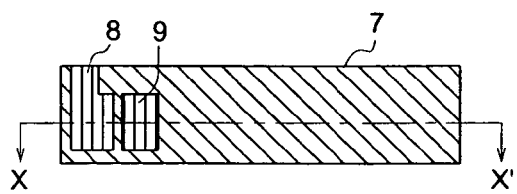
FIG. 1(5-b)
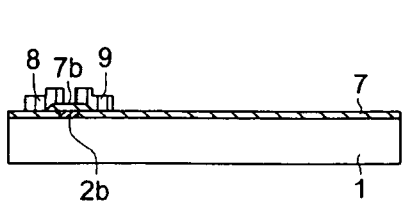
FIG. 1(6-a)
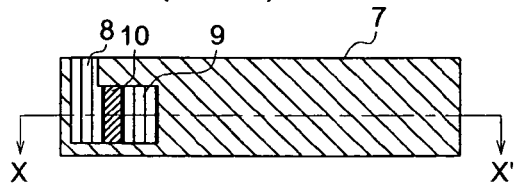
FIG. 1(6-b)
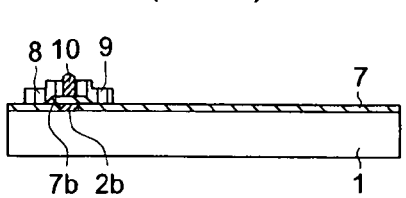

FIG. 5 (1-a)
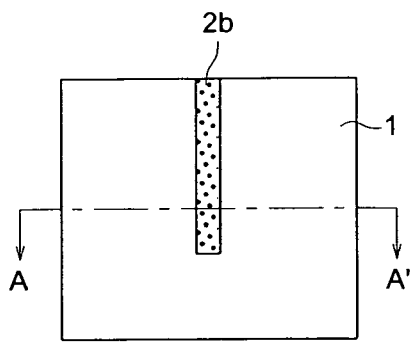
FIG. 5 (1-b)
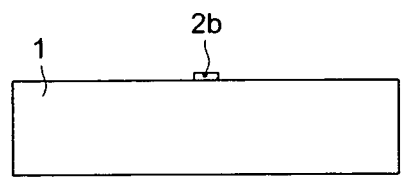
FIG. 5 (2-a)
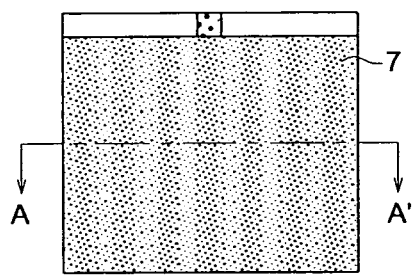
FIG. 5 (2-b)
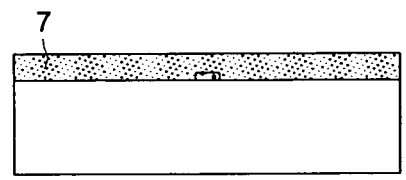
FIG. 5 (3-a)
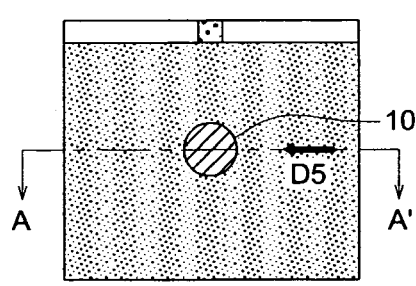
FIG. 5 (3-b)
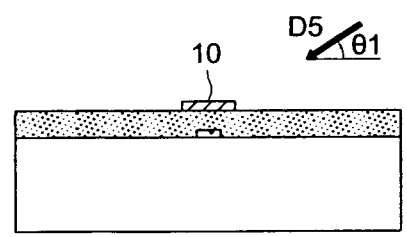
FIG. 5 (4-a)
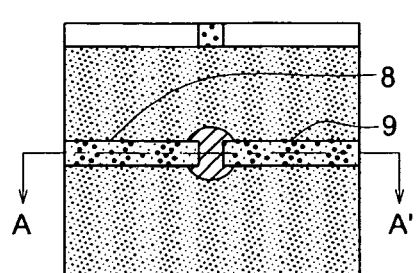
FIG. 5 (4-b)
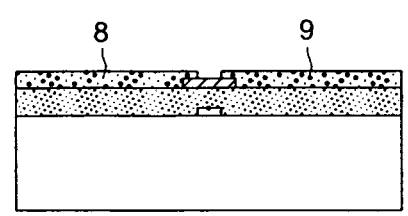

FILM FORMATION METHOD AND MANUFACTURING EQUIPMENT FOR FORMING SEMICONDUCTOR LAYER

This application is based on Japanese Patent Application No. 2005-328588 filed on Nov. 14, 2005, in Japanese Patent Office, the entire content of which is hereby incorporated by reference.

TECHNICAL FIELD

The present invention relates to a method for forming a semiconductor layer by performing film formation and manufacturing equipment for forming a semiconductor layer.

BACKGROUND

In accordance with popularization of information terminals, the needs for a flat panel display as a display of a computer have been increasing. Further, in accordance with development of information oriented society, since information conventionally provided on a paper medium has come to be provided as electronic data, the needs for electronic paper or digital paper as a mobile display medium, which is thin and light as well as is easily portable, are increasing. In view of such a background, development of a flat panel display device has come to be in progress.

Generally, in a flat panel display device, a display medium is formed by use of an element utilizing such as liquid crystal, organic EL and electrophoresis. Further, to assure display uniformity of an image plane and rewriting speed of an image plane, a technology utilizing an active operating element constituted of a thin layer transistor (hereinafter, being called as a TFT) has come to be a mainstream.

Herein, a TFT element is generally manufactured by successively forming a semiconductor layer primarily comprising such as a-Si (amorphous silicon) and p-Si (polysilicon) and metal layers of such as source, drain and gate electrodes on a glass substrate.

Conventionally, to form a bus line, an electrode pattern and a semiconductor layer on a substrate, patterning in a circuit form is generally performed by means of a photolithographic technology (hereinafter, being also referred to as a photolithographic method). A photolithographic technology is a method, in which after photosensitive resist is coated on a thin layer to be patterned, which is exposed through a photomask and developed, the exposed thin layer portion is subjected to patterning by dry etching or wet etching. And after patterning, unnecessary resist is peeled off and layer formation of the overlying materials is repeated to prepare a semiconductor material.

In this manner, a photolithographic method has been utilized for fabrication of a TFT element; however, there were problems that the manufacturing process is complex in addition to large scale equipment such as a clean room is necessary. In recent years, as a technology to compensate the demerit of a conventional manufacturing process of a TFT element utilizing a photolithographic process, extensive research and development on an organic TFT element, utilizing organic semiconductor materials, is in progress (refer to JP-A 10-190001 (hereinafter, JP-A refers to Japanese Laid-Open Patent Publication No.), and Advanced Material (Review) No.2, 99 (2002)).

A manufacturing method of an organic TFT depends on an element structure, however, for example, in the case of a (bottom gate)-(bottom contact) structure in which a gate electrode is formed on a substrate, after a gate electrode has been formed on a substrate by utilizing a photolithographic technology, a gate insulation layer is formed on the gate electrode employing a TEOS source by means of plasma CVD or a coated insulation material is formed by means of printing.

Then, a source electrode and a drain electrode are formed by utilizing a photolithographic technology, and thereafter, a pretreatment is performed to form an organic semiconductor layer on the channel portion between a source electrode and a drain electrode.

An organic semiconductor material includes a high polymer material and a low molecular weight material, and the methods to form an organic semiconductor portion thereof on a channel portion are different from each other.

A forming method for an organic semiconductor portion comprising a high polymer material includes a method in which a polymer material being dispersed in a solvent or a solution of a polymer material being dissolved is coated to form a layer.

On the other hand, as for an organic semiconductor material comprising a low molecular weight material, film formation is performed by means of evaporation under vacuum; however, layer formation by coating is also partly applied by selecting a solvent and a dissolution condition. A spin coat method and an inkjet method are utilized for the coating, and a micro contact printing method has been also studied.

After an organic semiconductor material comprising a polymer material or a low molecular weight material has been coated, the coated organic semiconductor material is dried to remove a solvent. As a drying method, a method to evaporate a solvent under vacuum or a method to heat the material on a hot plate is applied.

In an assembly process of a TFT panel, it is general to fix an alignment of liquid crystal molecules at the time of no application of electric voltage by forming an alignment layer on the plane of a TFT substrate, on which a formed TFT is arranged, and applying a rubbing treatment. In a forming process of an alignment layer, a polyimide solution is coated on a substrate by means of such as printing, inkjet and spraying, and the alignment layer is dried in a drying process.

In a drying process, when a long time is required to dry an alignment layer, there is caused a problem of uneven drying and uneven alignment layer thickness. Therefore, a method to blow gas, having a temperature necessary to evaporate the solvent of an alignment layer, against the surface of the alignment layer has been proposed (refer to JP-A Nos. 2003-57625 and 11-264978).

In the case that applying a drying process under vacuum to dry a coated semiconductor material after having been coated, a grate amount of time is necessary for the drying process, which is one of demerits of a coated semiconductor, resulting in a problem against manufacturing at a low cost without a vacuum process. Further, in the case of drying by heating a substrate on a hot plate, the way of heat conduction from the hot plate is not uniform resulting in uneven drying depending on the places on the substrate, whereby a problem of causing uneven characteristics among elements on a allay substrate.

On the other hand, in JP-A Nos. 2003-57625 and 11-264978, a method to dry an alignment layer coated on a substrate, on which a TFT is formed, in a short time is disclosed, however, a method to dry a semiconductor material to form a TFT is not disclosed; therefore these are not applicable for fabricating a TFT.

SUMMARY

The present invention has been made in view of the above-described problems, and an object of the present invention is to provide a film forming method of a semiconductor which can form a uniform layer at a low cost and manufacturing equipment for forming a semiconductor layer, by blowing gas against a coated layer of a semiconductor material to shorten drying time and to depress uneven drying.

In view of forgoing, one embodiment according to one aspect of the present invention is a film formation method for forming a semiconductor layer on a substrate, the method comprising the steps of:
 coating semiconductor material including solvent to the substrate; and
 blowing gas against a semiconductor material coated layer including the solvent on the substrate.

According to another aspect of the present invention, another embodiment is a manufacturing equipment for forming a semiconductor layer on a substrate, comprising:
 a coating structure for coating semiconductor material including solvent on a surface of the substrate; and
 a gas blowing structure for blowing gas against a semiconductor material coated layer including the solvent on the substrate.

BRIEF DESCRIPTION OF THE DRAWINGS

FIGS. 1(1-a) and 1(1-b)-FIGS. 1(6-a) and 1(6-b) are illustrative drawings to explain a manufacturing method of a thin layer transistor (hereinafter, being referred to as a TFT) according to an embodiment of the present invention.

FIGS. 5(1-a) and 5(1-b)-FIGS. 5(4-a) and 5(4-b) are illustrative drawings to explain a constitution of a TFT fabricated in example 4 and a fabrication procedure thereof.

DETAILED DESCRIPTION OF THE PREFERRED EMBODIMENT

Figure 2:
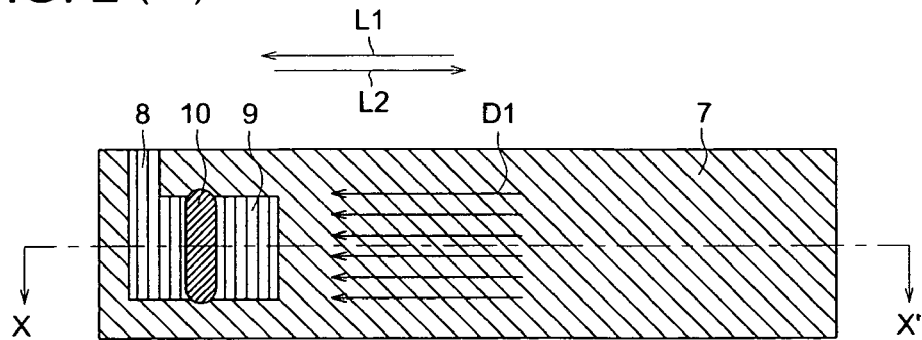
FIG. 2(a)-2(d) are illustrative drawings to explain a process to dry semiconductor layer 10 in the embodiment.
Figure 2:
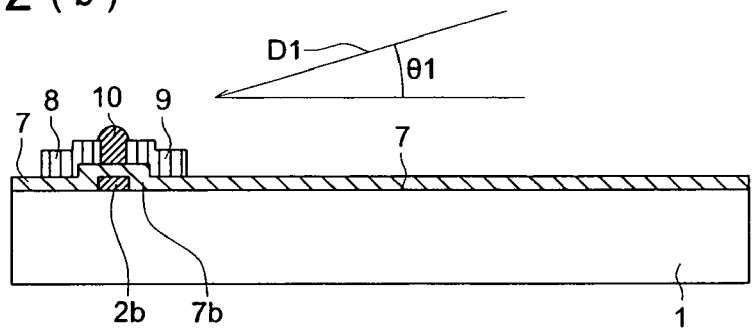
Figure 2:
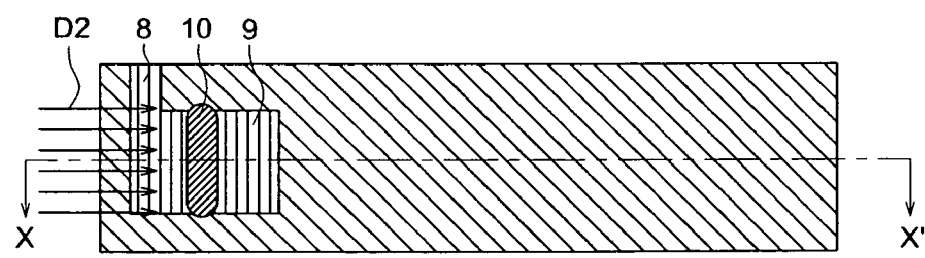
Figure 2:
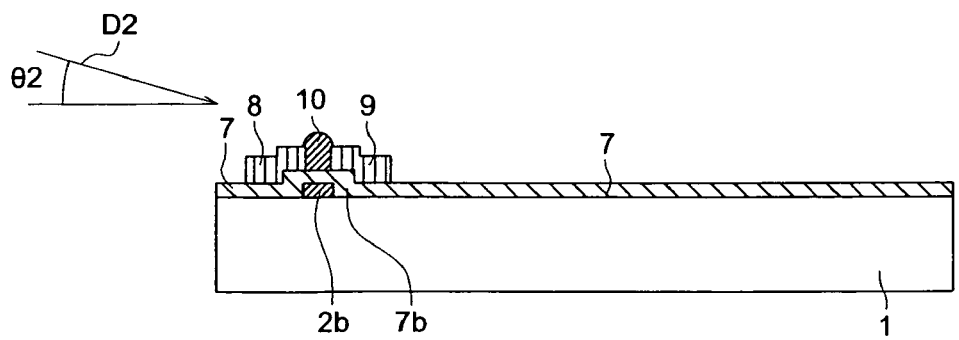

In the following, the present invention will be detailed with reference to preferred embodiments. While the preferred embodiments of the present invention have been described using specific terms, such description is for illustrative purpose only, and it is to be understood that changes and variations may be made without departing from the spirit or scope of the appended claims.

FIGS. 1(1-a) and 1(1-b)-FIGS. 1(6-a) and 1(6-b) are illustrative drawings to explain a manufacturing method of a thin film transistor (hereinafter, referred to as a TFT) according to an embodiment of the present invention. A manufacturing method, in the case of forming a bottom gate type TFT by providing gate electrode 2b on substrate 1, and further forming gate insulation layer 7b and semiconductor layer 10 followed by providing source electrode 8 and drain electrode 9, will be explained in due order by use of FIGS. 1(1-a) and 1(1-b)-FIGS. 1(6-a) and 1(6-b). Herein, the present invention is not limited to an application for a bottom gate type, but is applicable to any element constitution such as a top gate type, a vertical type, and a top and bottom type.

FIGS. 1(1-a)-1(6-a) are plane views to look over substrate 1, and FIGS. 1(1-b)-1(6-b) are cross-sectional views when substrate 1 is cut at plane X-X' in FIGS. 1(1-a)-1(6-a).

As an example of a manufacturing method of an organic TFT according to the present invention, the following processes S1-S6 will now be explained. S1: a process to form resist layer 4 of each electrode pattern on substrate 1 on which conductive thin layer 2 has been formed. S2: a process to etch substrate 1. S3: a process to remove resist layer 4 on gate electrode 2b. S4: a process to form gate insulation layer 7. S5: a process to form source electrode 8 and drain electrode 9. S6: a process to form semiconductor layer 10 between source electrode 8 and drain electrode 9.

In the following each process will be explained in due order.

S1: a process to form resist layer 4 of each electrode pattern on substrate 1 on which conductive thin layer 2 has been formed.

After photosensitive resist is coated on substrate 1 on which conductive thin layer 2 has been formed, said resist layer is exposed through a photomask and developed, whereby resist layer 4 of each electrode pattern is formed. In process S1, resist layer 4b is formed on substrate 1 as shown in FIG. 1(1-a) and FIG. 1(1-b).

Herein, in the present invention, a material of substrate 1 is not specifically limited. For example, glass or a flexible sheet made of resin can be utilized. As conductive thin layer 2, utilized can be a metal material having a low resistance such as Al, Cr, Ta, Mo and Ag or an accumulated structure thereof, in addition to those doped with other materials to improve heat resistance and adhesion to a support substrate as well as to prevent defects, of a metal thin layer. Further, a transparent electrode such as ITO, IZO, SnO and ZnO can be also utilized.

S2: a process to etch substrate 1.

The portions without resist layer 4 on conductive thin layer 2 are removed as shown in FIG. 1(2-a) and FIG. 1(2-b).

S3: a process to remove resist layer 4 on gate electrode 2b.

Resist layer 4 on gate electrode 2b is removed as shown in FIG. 1(3-a) and FIG. 1(3-b).

S4: a process to form gate insulation layer 7.

Gate insulation layer 7 is formed as shown in FIG. 1(4-a) and FIG. 1(4-b).

Gate insulation layer 7 is formed by a dry process such as evaporation, spattering, a CVD method and an atmospheric pressure plasma method. As gate insulation layer 7, various insulation layers can be utilized without specific limitation of the material. For example, inorganic oxide film having a relatively high specific inductive capacity such as silicon oxide, aluminum oxide, tantalum oxide and titanium oxide is utilized. Further, utilized can be also an organic material such as PVP, polyimide and a polysiloxane type or an inorganic material having coating adaptability.

S5: a process to form source electrode 8 and drain electrode 9.

Source electrode 8 and drain electrode 9 are formed as shown in FIG. 1(5-a) and FIG. 1(5-b). Source electrode 8 and drain electrode 9 are formed, for example, by deposition of gold by spattering. Herein gold is shown as an example, however, the material is not specifically limited to gold but various materials such as platinum, silver, copper and aluminum can be utilized. Further, a conductive organic material exemplified by PEDOT/PSS and a coating material comprising dispersion of metal nano-particles can be also utilized as a coating material.

S6: a process to form semiconductor layer 10 between source electrode 8 and drain electrode 9.

As shown in FIG. 1(6-a) and FIG. 1(6-b), semiconductor layer 10 is formed so as to electrically connect source electrode 8 and drain electrode 9 as well as to come in contact with gate electrode 7b.

Any material can be utilized as a semiconductor material provided being able to be dissolved or dispersed in a solvent. In addition to an organic polymer material, recently, pentacene, which is a low molecular weight material, is coated by being dissolved in a heated solvent, and either a low molecular weight material or a polymer material can be utilized.

Further, the present invention can be applied to even an organic inorganic hybrid material or an inorganic material, provided that the material is capable of forming a semiconductor layer by coating with a solvent and drying the solvent.

As a typical example of a material to be coated, utilized can be any soluble semiconductor such as polythiophenes such as poly(3-hexylthiophene), aromatic oligomers such as oligothiophene having a side chain based on a hexamer of thiophene, pentacenes comprising benzene having a substituent to increase solubility, copolymer of fluorene and bithiophene (F8T2), polythienylene vinylene or phthalocyanine. In particular, pentacenes include silylethynylpentacene such as 6,13-bistriisopropylsilyl ethinylpentacene and 6,13-bistriethylsilyl ethynylpentacene. These are semiconductor materials disclosed in U.S. Pat. No. 6,690,029 as a patent document and in J. Am. Chem. No. 127, pp. 4986-4987 (2005) as a nonpatent document, and pentacenes are provided with two substituents to control the interaction between molecules, whereby a high mobility is achieved. The chemical structure is shown below, and a part of a benzene ring may be substituted by such as a thiophene ring.

[Chemical Formula 1]

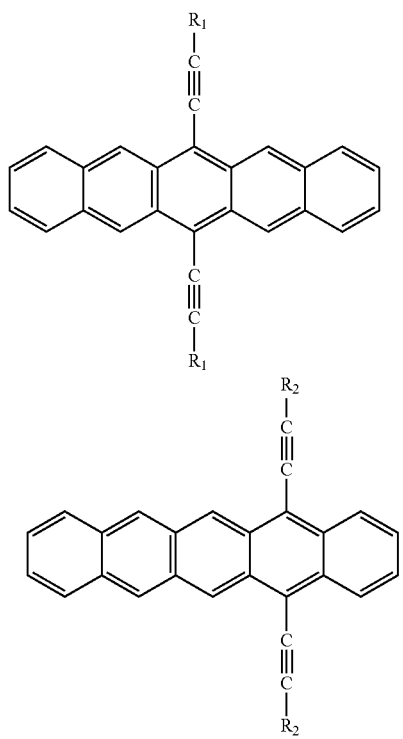

$R_1$ is $SiR_2$ (a silyl group), wherein, $R_2$ is a hydrogen atom,
a branched or non-branched alkyl group having a carbon number of 1-10,
a branched or non-branched alkoxy group having a carbon number of 1-10,
or a branched or non-branched alkenyl group having a carbon number of 2-10.

For example, after having been subjected to a treatment called as an OTS treatment to immerse a substrate in a solution, in which octadecyltrichlorosilan is dissolved in toluene at 0.1 ml/L, as a pre-treatment to form semiconductor layer 10, a solution, in which such as poly(3-hexylthiophene) is dissolved in dichlorobenzene at a concentration of 0.3 mass % as a semiconductor material is coated between source electrode 8 and drain electrode 9 by a spin coat method, whereby semiconductor layer 10 is formed. A film forming method for semiconductor layer 10 is not specifically limited and an inkjet method and a micro contact print method in addition to a spin coat method can be employed.

Next, process S7 to blow gas to evaporate the solvent of semiconductor layer 10 having been formed in S6 will be explained with reference to FIGS. 2-a-2-d.

FIGS. 2(a)-2(d) are illustrative drawings to explain a process to dry semiconductor layer 10, which has been formed between source electrode 8 and drain electrode 9 and explained in FIG. 1(6-a) and FIG. 1(6-b). The same number is attached to the same constituting elements as those in FIGS. 1(1-a) and 1(1-b)-FIGS. 1(6-a) and 1(6-b) and the explanation will be omitted. FIGS. 2(a) and 2(c) are front views, and FIGS. 2(b) and (d) are cross-sectional views when FIGS. 2(a) and 2(c) are cut at cross-section X-X'.

Arrow heads represented by D1 and D2 in FIG. 2(b) and 2(d) show the direction of blowing gas from air blower 31, which is not shown in the drawings, to evaporate the solvent of semiconductor layer 10 having been formed on substrate 1. Further, θ1 and θ2 are angles to blow gas against substrate 1. Air blower 31 is a gas blowing formation of this embodiment.

Directions D1 and D2 to blow gas coincide with directions L1 and L2 of the electric current, which flows between source electrode 8 and drain electrode 8, respectively.

As will be explained in example 2 later, the mobility and ON/OFF current ratio of an organic TFT, semiconductor layer 10 of which is formed employing poly(3-hexylthiophene) as a semiconductor material, are most superior when the directions to blow gas D1 and D2 coincide to the directions of an electric current L1 and L2, respectively. Further, as will be explained in example 4, a similar result was obtained also in the case of an organic TFT, semiconductor layer 10 of which was formed employing 6,13-bistriisopropylsilyl ethynylpentacene as a semiconductor material.

In this manner, in examples 2 and 4, the directions of L1 and L2 provided excellent results, however, the direction is not limited to those of L1 and L2 and it is preferable to blow gas along the direction to achieve the best electric characteristics depending on a semiconductor material. Further, regardless of the direction of blowing gas, an effect to evaporate the solvent of semiconductor layer 10 can be obtained. For example, gas may be blown along the directions perpendicular to L1 and L2.

Hereinafter, in the explanation of FIG. 2(a)-2(d), directions D1 and D2 to blow gas are referred to as directions L1 and L2, respectively. Further, the directions perpendicular to D1 and D2 are referred to as directions perpendicular to L1 and L2.

Angles θ1 and θ2 to blow gas against substrate 1 may be 900, that is, gas may be blown from right over substrate 1, or an effect to evaporate the solvent can be obtained even when angles θ1 and θ2 against substrate 1 are 00, that is, parallel to substrate 1, however, time until the solvent being evaporated can be made shortest when θ1 and θ2 are approximately 30°. θ1 and θ2 are preferably not more than 45° and are more preferably approximately 30°.

The type of gas utilized for drying is preferably nitrogen or an inert gas. Further, temperature of gas is from room temperature to approximately 200° C. Temperature of gas depends on the utilized solvent and the heat-resistant temperature of a semiconductor material. The gas temperature becomes low when a high volatile solvent is utilized, while the temperature becomes high when a low volatile solvent having a high boiling point is utilized.

Further, temperature of gas should be lower than decomposition temperature of a semiconductor material. The temperature may be over the softening point of a semiconductor material provided that there causes no influence to other materials. The shape of a blowing outlet of gas is not specifically limited; however, is preferably one capable of blowing gas in a linear form.

The flow rate of gas per unit time depends on a solvent to be evaporated, however, is preferably not lower than 0.5 L/(min·mm$^2$). The rate to send gas may be lowered at first and may be accelerated as dying proceeds.

As a method to blow gas, gas may be sent all over substrate 1 by linearly sliding a member to blow out gas in the parallel direction against the substrate, or a table holding the substrate may be shifted while the member to blow out gas is fixed, or the both may be shifted. Further, the both may be fixed.

According to an embodiment of the present invention, since a coated semiconductor material can be dried in a short period of time, a semiconductor layer can be formed uniformly at a low cost.

EXAMPLES

In the following, examples performed to confirm the effects of an embodiment according to the present invention will be explained; however, the present invention is not limited thereto.

Example 1

In this example, in a process to form 30×20 to total 600 pieces of an organic TFT of on substrate 1, an effect was confirmed by varying conditions of process S7 to blow gas to evaporate the solvent of semiconductor layer 10.

[Fabrication of Organic TFT]

Since this TFT was fabricated based on processes S1-S6 explained in FIGS. 1(1-a) and 1(1-b)-FIGS. 1(6-a) and 1(6-b), each process will be explained under the same numbering while omitting the commonly employed procedures.

S1: As substrate 1, a glass substrate having a size of 150 mm×170 mm, on the surface of which an AlNd layer as a conductive thin layer had been formed, was utilized. Resist was applied on this substrate 1 at a layer thickness of approximately 1 μm, which was exposed and developed.

S2: An AlNd layer is subjected to etching.

S3: Resist layer 4 on gate electrode 2b is removed.

S4: As gate insulation layer 7, SiO$_2$ layer is deposited on substrate 1 at a thickness of 500 nm by use of a TEOS (tetraethoxysilan) gas by means of a plasma CVD method.

S5: After washing, positive resist thin layer is formed on gate insulation layer 7 at a layer thickness of approximately 1 μm, and the resulting substrate is exposed through a photomask having a pattern of the reversed form of drain electrode 9. Next, resist at only the portions, on which source electrode 8 and drain electrode are to be provided, is removed, and resist is left at the portions on which no electrodes are to be provided. Au is spattered to make a layer of approximately 50 nm, whereby source electrode 8 and drain electrode 9 are formed and then resist is removed.

S6: After performing an OTS (octadecyltrichlorosilan) treatment, as a pretreatment to form semiconductor layer 10, to immerse the substrate in a solution comprising octadecyltrichlorosilan dissolved in toluene at 0.1 mol/L, a solution comprising poly(3-hexylthiophene) dissolved in dichlorobenzene at a concentration of 0.3 mass %, as a semiconductor material, is coated between source electrode 8 and drain electrode 9 by spin coating, whereby semiconductor layer 10 is formed. The chemical structure of poly(3-hexylthiophene) is shown bellow.

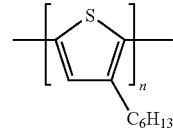

[Chemical Formula 2]

Experiments were carried out varying conditions of process S7 to dry semiconductor layer 10 having been formed on substrate 1 in the above manner.

Conditions of process S7 of example 1 will be explained.

Substrate 1 was placed on a table, which is not shown in the drawings, and dried by blowing gas in the direction of arrow head D1 from air blower 31, which is not shown in FIG. 2(a)-2(d). Air blower 31 is equipped with a heating device and capable of blowing gas having been heated at a predetermined temperature. Temperature of the gas was set to 25° C. or to 80° C.

Air blower 31 was fixed and the table was shifted to send wind all over the substrate, whereby a solvent was evaporated. As described before, since the direction of arrow head D1 is identical to the direction of L1, the direction D1 is, hereinafter, referred to as L1 direction.

Gas blown from air blower 31: nitrogen gas

Flow rate of gas: 2.0 L/(min·mm$^2$)

Temperature of gas: 25° C. or 80° C.

Temperature of table: 25° C. or 80° C.

Shifting rate of table: approximately 2 m/min

Blowing direction of gas: L1 direction (illustrated in FIG. 2(a))

Gas blowing angle θ1: 30°

[Experimental Result]

The experimental result is shown in table 1. In this experiment, 24 pieces of organic TFT elements out of 600 pieces of organic TFT elements on each glass substrate, which were prepared by varying the drying condition, were randomly selected, and mobility and ON/OFF current ratio (current value between source-drain when TFT is ON/current value between source-drain when TFT is OFF) were evaluated.

TABLE 1

| | Drying conditions | | | Measurement results of mobility (cm²/Vs) of TFT | | | Measurement results of ON/OFF current ratio of TFT | | |
|---|---|---|---|---|---|---|---|---|---|
| | *1 | Gas temperature | Table temperature | Average value of mobility | *2 | *2/average value | Average value of ON/OFF current ratio | *2 | *2/average value |
| Comparative example 1 | No | — | 25° C. | 0.0005 | 0.00071 | 1.420 | 3.9E+03 | 2341 | 0.600 |
| Comparative example 2 | No | — | 80° C. | 0.0035 | 0.00342 | 0.977 | 1.9E+04 | 9186 | 0.483 |
| Example 1-1 | Yes | 25° C. | 25° C. | 0.0022 | 0.00035 | 0.159 | 8.1E+03 | 4872 | 0.601 |
| Example 1-2 | Yes | 25° C. | 80° C. | 0.0041 | 0.00065 | 0.159 | 2.0E+04 | 9238 | 0.462 |
| Example 1-3 | Yes | 80° C. | 80° C. | 0.0082 | 0.00042 | 0.051 | 3.2E+04 | 14700 | 0.459 |
| Comparative example 3 | | Vacuum drying for 10 hours | | 0.0104 | 0.00020 | 0.019 | 4.4E+04 | 18371 | 0.418 |

*1: Whether air is blown or not,

*2: Standard deviation

Comparative examples 1 and 2 are experimental examples in which substrate 1 same as that of an example was dried without blowing gas. Drying was performed at a table temperature being set to 25° C. for comparative example 1 and 80° C. for comparative example 2. The measurement was performed when approximately 24 hours had passed after the drying. Further, comparative example 3 is an experimental example in which substrate 1 same as that of an example was dried by vacuum drying for 10 hours.

In examples 1-1, 1-2 and 1-3, the temperature of blown gas and the temperature of a table were varied to assure the effect.

In example 1-1, the gas temperature was set to 25° C. and the table temperature to 25° C. It has been confirmed that an organic TFT fabricated in example 1-1 is superior in mobility and resistance ratio and variation thereof is also small, compared to the case of comparative example 1 in which drying was carried out at the table temperature of 25° C. without blowing gas.

In example 1-2, the gas temperature was set to 25° C. and the table temperature to 80° C. Example 1-2 exhibits superior mobility and resistance ratio compared to example 1-1, and the effect of heating the table has been confirmed. Further, it has been confirmed that an organic TFT fabricated in example 1-2 is superior in mobility and resistance ratio and variation thereof is also small, compared to the case of comparative example 2 in which drying was carried out at the table temperature of 80° C. without blowing gas.

In example 1-3, the gas temperature was set to 80° C. and the table temperature to 80° C. Example 1-3 exhibits superior mobility and resistance ratio compared to example 1-2, which has confirmed the effect of heating the gas. Further, it has been confirmed that example 1-3 has superior capabilities to show mobility and resistance ratio nearly equal to an organic TFT fabricated in comparative example 3 which was prepared by drying under vacuum for 10 hours.

Example 2

In the following, example 2, which has been carried out to confirm the effect of an embodiment of the present invention, will be explained.

In this example, a sample was fabricated on substrate 1 same as example 1 and according to processes S1-S6 same as example 1. In process S6, semiconductor layer 10 was prepared by coating a semiconductor material same as example 1 between source electrode 8 and drain electrode 9 by means of an inkjet method.

In the present invention, the blowing direction and blowing angle θ1 in process S7 to blow gas to evaporate the solvent of semiconductor layer 10 were varied to confirm the effect thereof.

[Experimental Condition 2]

Gas blown from air blower 31: present (nitrogen gas)

Flow rate of gas: 2.0 L/(min·mm²)

Temperature of gas: 80° C.

Temperature of table: 80° C.

Shifting rate of table: approximately 2 m/min

Blowing direction of gas: L1 direction (illustrated in FIG. 2(a)), direction perpendicular to L1

Gas blowing angle θ1: 30°

[Experimental Result]

The experimental result is shown in table 2. In this experiment, 24 pieces of organic TFT elements out of 600 pieces of organic TFT elements on each glass substrate, which were fabricated by varying the direction of gas blow, were randomly selected, and mobility and ON/OFF current ratio were evaluated.

TABLE 2

| | Drying conditions | | | | Measurement results | |
|---|---|---|---|---|---|---|
| | Whether air is blown or not | Direction of gas blow | Angle of gas blow θ1 | Gas temperature | Table temperature | Average value of mobility | Average value of ON/OFF current ratio |
| Example 2-1 | Yes | L1 direction | 30° | 80° C. | 80° C. | 0.072 | 3.2E+04 |
| Example 2-2 | Yes | L1 direction | 45° | 80° C. | 80° C. | 0.061 | 2.9E+04 |
| Example 2-3 | Yes | Direction perpendicular to L1 | 30° | 80° C. | 80° C. | 0.042 | 3.4E+04 |
| Comparative example 4 | Yes | Directly above | 90° | 80° C. | 80° C. | 0.011 | 9.80E+03 |

In example 2-1, the gas temperature was set to 80° C. and the table temperature to 80° C., and gas was blown in L1 direction. The gas blowing angle θ1 was approximately 30°.

In example 2-2, the gas temperature was set to 80° C. and the table temperature to 80° C., and gas blowing angle θ1 was approximately 45°.

In example 2-2, in which gas blowing angle θ1 was set to approximately 45°, both the mobility and resistance ratio were somewhat inferior to example 2-1 in which it was set to approximately 30°.

In example 2-3, the gas temperature was set to 80° C. and the table temperature to 80° C. and gas was blown in the direction perpendicular to L1. Both of examples 2-1 and 2-2 exhibited superior mobility and resistance ratio compared to example 2-3, and the effect of blowing gas in L1 direction has been confirmed.

As described above, examples 2-1 and 2-2, in which gas was blown in the direction parallel to the direction of electric current between two electrodes, exhibited higher mobility compared to example 2-3, in which gas was blown in the direction perpendicular to the direction of electric current between two electrodes. This is considered because the molecules were regularly aligned along the direction for flow of electric current and the molecular arrangement of poly(3-hexylthiophene) was made highly aligned in a large area, by blowing gas in the direction of electric current.

In comparative example 4, gas was blown from directly above, and the drying was not provided with a directional property. Thus, it is thought that the characters of mobility and variation are deteriorated because of no orientation in the arrangement of the semiconductor material. It is said that when the angle is shallow, the drying can have a directional property so that the arrangement of the semiconductor material has a directional property as the solvent evaporates, and the mobility is high, and the variation is small.

Further, it is considered that example 2-1 provided a mobility higher than example 2-2 because a solvent of poly(3-hexylthiophene) was dried faster in example 2-1 in which gas was blown at gas blowing angle θ1 of 30°.

FIGS. 3(a)-3(d) is an illustrative drawing to explain the molecular structure of poly(3-hexylthiophene) utilized in this semiconductor layer 10.

Figure 3:
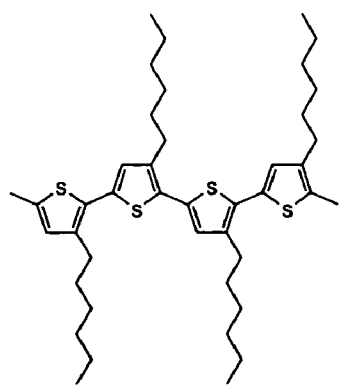
FIG. 3(a)-3(d) are illustrative drawings to explain a molecular structure of poly(3-hexylthiophene).
Figure 3:
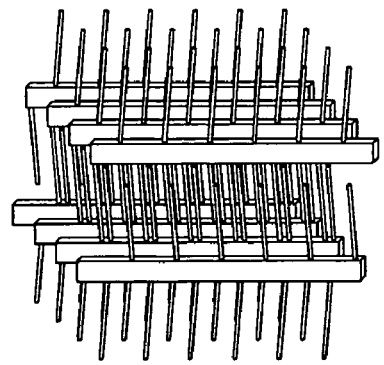
Figure 3:
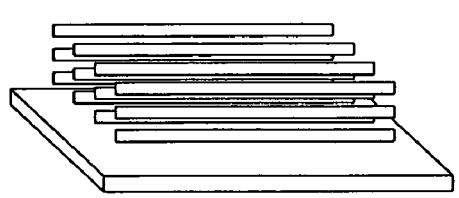
Figure 3:
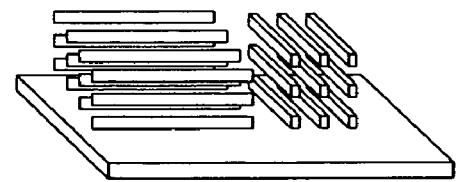

FIG. 3(a) is a drawing to show the molecular structure of poly(3-hexylthiophene). This polymer has a π conjugated electron and provided with a portion of aligned thiophene rings which contribute to conductivity, and a long alkyl group which is attached to increase solubility in a solvent.

FIG. 3(b) is a drawing to explain an ideal molecular arrangement. The ring portion of thiophene is simply expressed by a flat plane and the alkyl group portion by a narrow column. It is preferable to provide a molecular arrangement as shown in FIG. 3(b) after the drying process.

FIG. 3(c) is a drawing to show only thiophene ring portions of FIG. 3(b), and illustrates an ideal molecular arrangement. In example 2, it is considered that the thiophene ring potion are regularly aligned along the direction of an electric current to easily flow as shown in FIG. 3(c).

FIG. 3(d) illustrates poor molecular alignment, and the direction of the thiophene ring portions are scattered. It is considered that, in this state, boundaries among aligned molecular domains may increase resulting in inhibition of the mobility of carriers.

Example 3

In the following, example 3, which has been performed to confirm the effect of an embodiment according to the present invention, will be explained.

Figure 4:
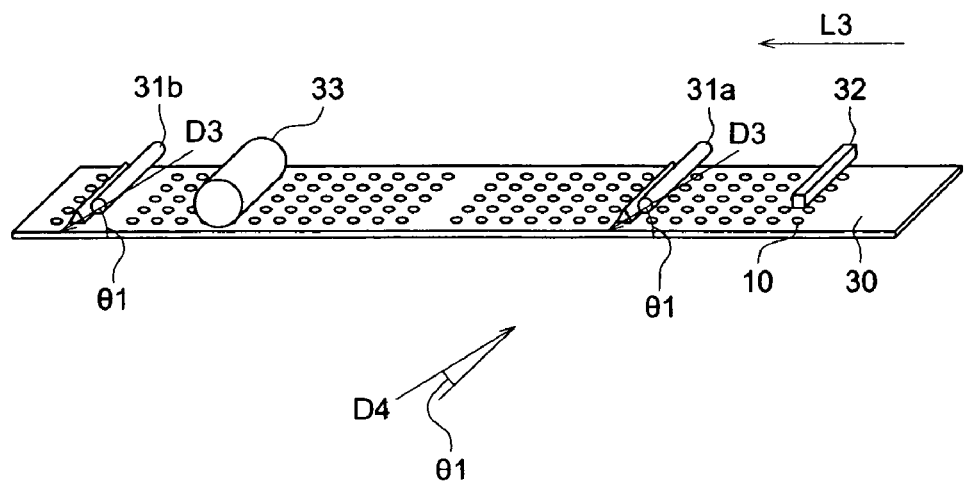
FIG. 4 is an illustrative drawing to explain a process to dry semiconductor layer 10 of example 3.

FIG. 4 is an illustrative drawing to explain a process to form and dry semiconductor layer 10 of example 3.

In this example, an organic TFT element is prepared by a roll-to-roll method in which film substrate 30, on which gate electrode 2b, gate insulation layer 7, source electrode 8 and drain electrode 6 have been formed in the previous process, is passed through the process as a roll form as it is. The material of film substrate 30 is polycarbonate provided with a gas barrier layer. Film substrate 30 is transported by rollers, which are not shown in the drawing, toward the direction of arrow head L3.

[Fabrication of Organic TFT Element]

Film substrate 30 was subjected to ultrasonic cleaning with an alkaline detergent in a cleaner, the detergent being removed in pure water by ultrasonic cleaning, and after the substrate being rinsed again, the substrate was pulled up from hot water followed by being blown for charge neutralization, and then the substrate was dried to remove moisture by blowing a hot wind heated at 150° C. from air blower 31, which is not shown in FIG. 4.

After forming a resist thin layer having a thickness of approximately 1 μm by a slit coat method utilizing a capillary phenomenon, the substrate was dried again by sending a hot wind heated at 150° C. from air blower 31 and was exposed through a photomask corresponding to the pattern of gate electrode 2b and a gate bus, which is a wiring portion to be connected to gate electrode 2b.

After exposure, development was carried out by a developer, followed by post-baking, etching of an Al electrode and removal of resist were carried out, whereby the pattern was formed.

Next, polyimide ink was transferred on the substrate by Flexographic printing machine, which performs printing by transferring ink from Anilox roll to a flexible relief plate, and dried on a hot plate by air blower 31, which is not shown in the drawing, followed by being baked, whereby a polyimide thin layer as gate insulation layer 7 was formed.

Source electrode 8 and drain electrode 9 employing PEDOT/PSS as a material, and further, a source bus which is a wiring portion to be connected to source electrode 8 employing silver paste as a material, were formed by use of inkjet 32.

A semiconductor material, employing the same material as example 1, was coated by use of inkjet 32 to form semiconductor layer 10.

In this example, after semiconductor layer 10 had been formed by use of inkjet 32, gas was blown from air blower 31*a* to evaporate the solvent of semiconductor layer 10. Experiments varying the gas blowing direction in two ways of arrow head D3 direction and arrow head D4 direction of FIG. 4 were performed to confirm the effect (hereinafter, being described as D3 direction and D4 direction). Arrow head D3 direction is identical to the direction (arrow head L3 direction) of electric current flown between a source electrode and a drain electrode of an organic TFT element, which is not shown in the drawing.

[Experimental Condition 3]
Gas blown from air blower 31*a*: present (nitrogen gas)
Flow rate of gas: 2.0 L/(min·mm²)
Temperature of gas: 80° C.
Temperature of table: 80° C.
Shifting rate of table: approximately 2 m/min
Blowing direction of gas: D3 direction, D4 direction (illustrated in FIG. 4)
Gas blowing angle θ1: 30°

Finally, an acryl type insulating protective layer was formed by Flexographic printing utilizing printing cylinder 33 wound with a Flxographic plate, which is shown in FIG. 4, and dried by blowing gas from air blower 31*b*, followed by being baked to complete an allay substrate.

[Experimental Result]

The experimental result is shown in table 3. In this experiment, 24 pieces of organic TFT elements among organic TFT elements on film substrate 30, which had been fabricated by varying the gas blowing direction, were selected, and mobility and ON/OFF current ratio were evaluated with respect to each element.

In example 3-1, the gas temperature was set to 80° C. and the table temperature to 80° C., and gas was blown against the substrate in direction D3. Organic TFT elements were arranged on substrate 30 so as to make the direction of current flown between source electrode 8 and drain electrode 9 coincide to direction D3.

In example 3-2, the gas temperature was set to 80° C. and the table temperature to 80° C., and gas was blown against the substrate in D4 direction perpendicular to D3 direction.

It has been confirmed that organic TFT elements prepared in example 3-1 and 3-2 exhibited mobility and resistance ratio equal to organic TFT elements prepared in example 2-1 and example 2-2, in which drying was carried out in a similar drying process.

Example 3-1 in which gas was blown against the substrate in D3 direction was superior in both mobility and resistance ratio compared to example 3-2. In this manner, also with example 3 utilizing film substrate 30, the effect by blowing gas in the direction parallel to the current direction flown between two electrodes has been confirmed.

Herein, in this example, the cases, in which the direction of current flown between a source electrode and a drain electrode of an organic TFT element formed on film substrate 30 always coincides with the direction of arrow head D3, were explained, however, to practice the present invention is not limited to such an arrangement. Even when a part of organic TFT elements aligned in the different direction from arrow head direction D3 for convenience of the substrate layout, the organic TFT elements may exhibit electric characteristics somewhat inferior to an organic TFT element prepared in example 3-1, in which gas was blown in D3 direction, but can be utilized depending on applications.

Example 4

In the following, example 4, which was performed to confirm the effect of an embodiment according to the invention, will be explained.

–*/FIGS. 5(1-*a*) and 5(1-*b*)-FIGS. 5(4-*a*) and 5(4-*b*) is an illustrative drawing to explain a process to dry semiconductor layer 10 formed between source electrode 8 and drain electrode 9, which has been explained in FIG. 1(6-*a*) and FIG. 1(6-*b*). The same numberings are made on the same constituent elements as those in FIGS. 1(1-*a*) and 1(1-*b*)-FIGS. 1(6-*a*) and 1(6-*b*), and explanation thereof is omitted. FIGS. 5(1-*a*)-(4-*a*) are front views, and FIGS. 5(1-*b*)-(4-*b*) are cross-sectional views of FIGS. 5(1-*a*)-(4-*a*) cut at cross-section A-A'.

In this example, an organic TFT element was prepared by utilizing a glass substrate on which gate electrode 2 and gate insulation layer 7 had been formed in the previous process in advance. An AlNd (aluminum neodium) layer at 125 nm as a

TABLE 3

| | Drying conditions | | | | Measurement results | |
| --- | --- | --- | --- | --- | --- | --- |
| | Whether air is blown or not | Angle of gas blow | Gas temperature | Table temperature | Average value of mobility | Average value of ON/OFF current ratio |
| Example 3-1 | Yes | D3 direction | 80° C. | 80° C. | 0.061 | 3.1E+04 |
| Example 3-2 | Yes | D3 direction | 80° C. | 80° C. | 0.029 | 3.1E+04 | gate electrode and SiO$_2$ layer at 500 nm employing a TEOS gas by means of a plasma CVD method as a gate insulation layer were formed on substrate 1.

6,13-bistriisopropylsilyl ethynylpentacene of silylethynylpentacenes as a semiconductor material which had been dissolved in toluene was applied by drops on substrate 1 by use of a dispenser, and dried by an air blower, which is not shown in the drawings, while the drying direction was set to the direction of arrow head D5 in the drawing. The direction of arrow head D5 is parallel to the direction of current flown between source electrode 8 and drain electrode 9. Further, comparative example 5 without drying with an air blower was prepared and evaluated for comparison.

6,13-bistriisopropylsilyl ethynylpentacene is a semiconductor material disclosed, for example, in U.S. Pat. No. 6,690,029 as a patent document and in J. Am. Chem. No. 125 pp. 4986-4987 (2005) as a non-patent document, and is provided with two substituents on pentacene to control the inter-molecular interaction, whereby a high mobility is achieved. The chemical structure of 6,13-bistriisopropylsilyl ethynylpentacene is shown below.

[Chemical Formula 3]

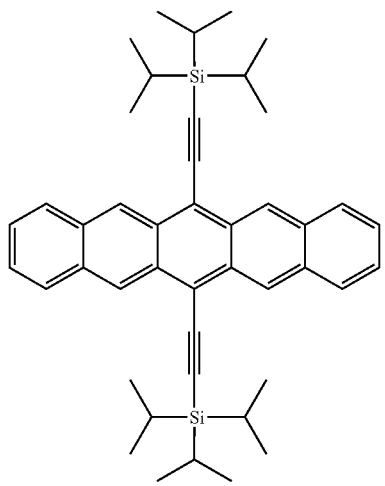

[Experimental Condition 4]
Gas blown form air blower: nitrogen gas
Flow rate of gas: 2.0 L/min·mm$^2$)
Temperature of gas: 80° C.
Temperature of table: 80° C.
Shifting rate of table: approximately 2 m/min
Blowing direction of gas: D5 direction (illustrated in FIGS. 5(3-*a*) and 5(3-*b*))
Gas blowing angle θ1: 30°

[Experimental Results]

The experimental result is shown in table 4. In this experiment, mobility and ON/OFF current ratio of organic TFT elements on glass plate 30, which had been fabricated by varying presence or absence of gas blowing, were evaluated.

TABLE 4

| | Drying conditions | | | | Measurement results | |
|---|---|---|---|---|---|---|
| | Whether air is blown or not | Angle of gas blow | Gas temperature | Table temperature | Average value of mobility | Average value of ON/OFF current ratio |
| Example 4-1 | Yes | D5 direction | 80° C. | 80° C. | 0.31 | 2.8E+04 |
| Comparative example 5 | No | — | 80° C. | 80° C. | 0.11 | 2.9E+04 |

In example 4-1, the gas temperature was set to 80° C. and the table temperature to 80° C., and gas was blown against the substrate. Source electrode 8 and drain electrode 9 are arranged, after forming a semiconductor layer, so that the direction of drying coincides with the current flow direction.

In comparative example 5, the sample substrate is dried on a table having a temperature of 80° C. without blowing gas.

Example 4-1, in which gas was blown in D5 direction, exhibited superior mobility compared to comparative example 5. Further, with respect to ON/OFF current ratio, example 4-1 and comparative example 5 showed an equal ability. In this manner, even in example 4-1 in which source electrode 8 and drain electrode 9 were formed after a semiconductor layer 10 containing 6,13-bisisopropylsilyl ethynylpentacene had been formed, confirmed has been the effect of blowing gas in the direction parallel to the direction of current flown between two electrode similar to other experiments.

The reason why example 4-1 showed a high mobility is considered because crystallization is provided with a directional property at drying by blowing gas similar to example 2. On the other hand, it is considered that comparative example 5 in which gas was not blown, the liquid drop dropped from the dispenser and spread on the substrate to be successively dried from the surroundings, resulting in making the orientation of crystallization of a random or co-centric circle form.

Example 5

Next, example 5, which has been performed to confirm the effect of an embodiment according to the present invention, will be explained.

In this example, the constitution and fabrication procedure are almost identical to example 4 which has been explained with reference to FIGS. 5(1-*a*) and 5(1-*b*)-FIGS. 5(4-*a*) and 5(4-*b*), except that oligothiophene was utilized as a semiconductor material.

The chemical structure of oligothiophene utilized this time is shown below. Thiophene oligomers are provided with approximately 15-20 benzene rings, and distinguished from polythiophenes having more benzene rings.

[Chemical Formula 4]

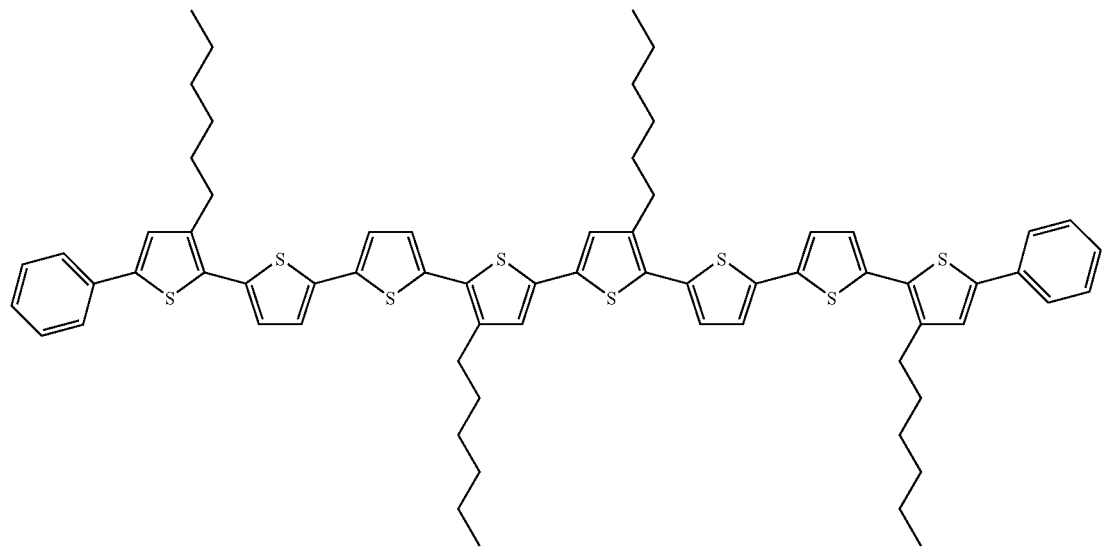

In the following, explanation of processes identical to example 4 are omitted and different points will be explained with reference to FIGS. 5(1-*a*) and 5(1-*b*)-FIGS. 5(4-*a*) and 5(4-*b*).

A solution of the aforesaid oligothiophene as a semiconductor material, employing cyclohexane and THF mixed at a mass ratio of 8/2 as a solvent, was applied by drops on substrate 1, which had been prepared in the procedure same as example 4, by use of a dispenser, and dried by an air blower, while setting the drying direction to the direction of arrow head D5 in FIGS. 5(3-*a*) and 5(3-*b*). The direction of arrow head D5 is parallel to the direction of current which flows between source electrode 8 and drain electrode 9.

Further, example 6 without drying with an air blower was prepared for comparison and evaluated.

[Experimental Condition 5]
  Gas blown from air blower: nitrogen gas
  Flow rate of gas: 2.0 L/(min·mm$^2$)
  Temperature of gas: 80° C.
  Temperature of table: 80° C.
  Shifting rate of table: approximately 2 m/min
  Blowing direction of gas: D5 direction (illuastrated in FIGS. 5(3-*a*) and 5(3-*b*)) Gas blowing angle θ1: 30°

[Experimental Result]
The experimental result is shown in table 5. In this experiment, mobility and ON/OFF current ratio of organic TFT elements on glass plate 30, which had been prepared by varying presence or absence of gas blowing, were evaluated.

TABLE 5

| | Drying conditions | | | | Measurement results | |
|---|---|---|---|---|---|---|
| | Whether air is blown or not | Angle of gas blow | Gas temperature | Table temperature | Average value of mobility | Average value of ON/OFF current ratio |
| Example 5 | Yes | D5 direction | 80° C. | 80° C. | 0.038 | 1.9E+04 |
| Comparative example 6 | No | — | 80° C. | 80° C. | 0.012 | 2.1E+04 |

In example 5, the gas temperature was set to 80° C. and the table temperature to 80° C., and gas was blown. After a semiconductor layer had been formed, source electrode 8 and drain electrode 9 were arranged so as to make the current direction identical to the drying direction.

In comparative example 6, the sample substrate was dried on a table heated at 80° C. without blowing gas.

Example 5, in which gas was blown, exhibited superior mobility compared to comparative example 6. Further, example 5 and comparative example 6 exhibited equal capability with respect to the ON/OFF current ratio. In this manner, even in example 5, in which source electrode 8 and drain electrode 9 were formed after semiconductor layer 10 had been formed, the effect of blowing gas in the direction parallel to the direction of current flown between two electrodes has been confirmed similar to other examples.

As described above, since a drying time is shortened and uneven drying is decreased by blowing gas against a coated semiconductor layer in this manner, it is possible to provide a film making method and equipment to form a semiconductor layer, which can form a uniform semiconductor layer at a low cost.

Herein, with respect to a semiconductor in examples of the present invention, electric characteristics have been improved by blowing gas in the direction parallel to the direction of current flown between source electrode 8 and drain electrode 9, however, the direction to blow gas may be set to the direction to best improve electric characteristics of an organic TFT depending on a semiconductor material.

What is claimed is:

1. A film formation method for forming a semiconductor layer on a substrate, the method comprising the steps of: coating a substrate having thereon at least a source electrode and a drain electrode, with semiconductor material including solvent; and blowing gas against the semiconductor material coated layer including the solvent on the substrate in a direction between 0.degree. and 45.degree. to a direction in which current flows between the source electrode and the drain electrode.

2. The film formation method for forming the semiconductor layer of claim 1, wherein a temperature of the gas is higher than an evaporating temperature of the solvent.

3. The film formation method for forming the semiconductor layer of claim 1, wherein in the gas is blown against the substrate loaded on a table, which is set to a predetermined temperature.

4. The film formation method for forming the semiconductor layer of claim 1, wherein the semiconductor layer includes at least one of thiophene oligomers, polythiophenes and silylethynylpentacenes.

5. The film formation method for forming the semiconductor layer of claim 1, wherein when forming a plurality of semiconductor elements on a substrate, each semiconductor element having a source electrode and a drain electrode, the source electrode and the drain electrode of each semiconductor element are arranged so that a direction of current between the respective source and drain electrodes are in a same direction for each semiconductor element.

* * * * *

UNITED STATES PATENT AND TRADEMARK OFFICE
CERTIFICATE OF CORRECTION

PATENT NO. : 7,754,525 B2
APPLICATION NO. : 11/595388
DATED : July 13, 2010
INVENTOR(S) : Jun Yamada et al.

It is certified that error appears in the above-identified patent and that said Letters Patent is hereby corrected as shown below:

In the Specification

In column 20, claim 1, line 1, before "to a direction in which" replace "0.degree.and 45.degree." with --0 degrees and 45 degrees--.

Signed and Sealed this
Eleventh Day of October, 2011

David J. Kappos
*Director of the United States Patent and Trademark Office*